United States Patent [19]

Kuhnert et al.

[11] Patent Number: 5,379,942
[45] Date of Patent: Jan. 10, 1995

[54] METHOD FOR PRODUCING A SEMICONDUCTOR MODULAR STRUCTURE

[75] Inventors: Reinhold Kuhnert; Herbert Schwarzbauer, both of Munich, Germany

[73] Assignee: Siemens Aktiengesellschaft, Munich, Germany

[21] Appl. No.: 157,915

[22] Filed: Nov. 24, 1993

[51] Int. Cl.6 .................. B23K 20/00; B23K 20/16
[52] U.S. Cl. ........................ 228/106; 228/5.5; 228/212; 437/212
[58] Field of Search ............... 228/106, 123.1, 193, 228/235.1, 212, 5.5, 44.7; 437/212

[56] References Cited

U.S. PATENT DOCUMENTS

| | | | |
|---|---|---|---|
| 4,903,885 | 2/1990 | Schwarzbauer | 228/106 |
| 5,058,796 | 10/1991 | Schwarzbauer | 228/5.5 |
| 5,158,226 | 10/1992 | Schwarzbauer | 228/5.5 |
| 5,300,458 | 4/1994 | Kuhnert et al. | 228/106 |

FOREIGN PATENT DOCUMENTS

| | | |
|---|---|---|
| 0330895 | 9/1989 | European Pat. Off. . |
| 0330896 | 9/1989 | European Pat. Off. . |
| 3917765 | 12/1990 | Germany . |
| 3940933 | 6/1991 | Germany . |

*Primary Examiner*—Smauel M. Heinrich

[57] ABSTRACT

A method for producing a semiconductor modular structure includes placing semiconductor bodies, a ceramic substrate with metallizing, and a metal base plate, in an elastomer compression mold. A heatable pressure ram with a surface being concave relative to the base plate is placed on the base plate. At least the base plate and the ceramic substrate are convexely deformed and joined with pressure exerted by the pressure ram, at a temperature above room temperature.

4 Claims, 1 Drawing Sheet

METHOD FOR PRODUCING A SEMICONDUCTOR MODULAR STRUCTURE

BACKGROUND OF THE INVENTION

Field of the Invention

The invention relates to a method for producing a semiconductor modular structure with a metal base plate, a ceramic substrate being joined materially to the base plate and being provided with a metallizing, and semiconductor bodies being materially joined to the metallizing, in which the base plate is convexly deformed by a pressure ram.

Such a method has been described, for instance, in German Published, Non-Prosecuted Application DE 39 40 933 A1. There an already-soldered modular structure is placed by its base plate on a compression mold that is concave with respect to the base plate. Then the mold is heated to just below the melting temperature of the solder, and the metal base plate is deformed by a pressure ram having a shape which is adapted to the compression mold. The pressure ram is placed on the long sides of the base plate. The deformation of the base plate compensates for the bimetallic effect that results from the material joining of the ceramic substrate and the base plate. The mechanical strain between the substrate and the base plate is reduced by plastic deformation in the layer of solder. The compensation results in the base plate being shaped convexly with respect to a cooling body and being able to be placed flat against the cooling body by means of screws.

SUMMARY OF THE INVENTION

It is accordingly an object of the invention to provide a method for producing a semiconductor modular structure, which overcomes the hereinafore-mentioned disadvantages of the heretofore-known methods of this general type and in which producing a curvature of a base plate and producing a joining layer between the base plate and a ceramic substrate can be performed in a single operation.

With the foregoing and other objects in view there is provided, in accordance with the invention, a method for producing a semiconductor modular structure, which comprises placing semiconductor bodies, a ceramic substrate with metallizing, and a metal base plate, in an elastomer compression mold; placing a heatable pressure ram with a surface being concave relative to the base plate, on the base plate; and convexely deforming and joining at least the base plate and the ceramic substrate with pressure exerted by the pressure ram, at a temperature above room temperature.

In accordance with another mode of the invention, there is provided a method which comprises placing metal layers between the semiconductor bodies and the metallizing as well as between the metallizing and the base plate, and joining the metal layers, the semiconductor bodies, the metallizing and the base plate to one another by pressure sintering.

In accordance with a further mode of the invention, there is provided a method which comprises placing metal layers between the semiconductor bodies and the metallizing as well as between the metallizing and the base plate, and joining the metal layers, the semiconductor bodies, the metallizing and the base plate to one another by diffusion welding.

In accordance with a concomitant mode of the invention, there is provided a method which comprises soldering the semiconductor bodies, the metallizing and the base plate prior to being placed in the compression mold, and performing the deformation step at a temperature being lower than a melting temperature of the solder.

Other features which are considered as characteristic for the invention are set forth in the appended claims.

Although the invention is illustrated and described herein as embodied in a method for producing a semiconductor modular structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
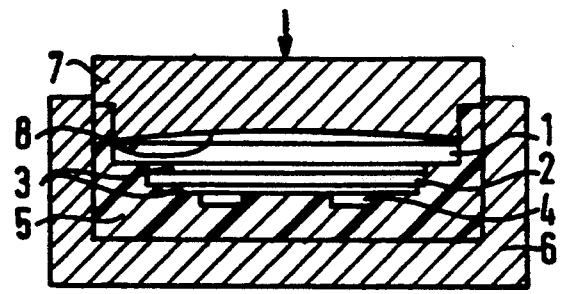
FIG. 1 is a diagrammatic, longitudinal-sectional view of a compression mold with parts of a semiconductor modular structure placed therein.

Referring now to the figures of the drawing in detail and first, particularly, to FIG. 1 thereof, there is seen a modular structure which includes a metal base plate 1, a ceramic substrate 2 and semiconductor bodies 4. The ceramic substrate 2 is provided with metallizings 3 on both sides, which may, for instance, be copper conductor tracks applied by the DCB (direct copper bonding) process. However, the metallizings 3 may be formed of other metals instead and may be thinner than metal layers applied by the DCB process. Nevertheless, one of the metallizings 3 must be capable of being materially joined directly or indirectly to the metal base plate 1. The other metallizing 3 is located between the ceramic substrate 2 and the semiconductor bodies 4. This metallizing must permit the semiconductor bodies 4 to be either directly or indirectly materially secured. Material joining refers to the fact that the materials of the elements are joined together.

The parts of the modular structure are placed in an elastomer mold 5 in such a way that the semiconductor bodies 4 are located at the bottom, the ceramic substrate 2 rests on them, and the base plate 1 rests on the ceramic substrate. The elastomer mold is formed of elastically deformable material, such as silicon rubber and it is placed in a receiving mold 6 that surrounds the elastomer mold 5 laterally and at the bottom in a gap-free manner. A heatable pressure ram 7 is placed on the base plate 1 and has a surface 8 that is curved in concave fashion relative to the base plate 1. The pressure ram also closes off the elastomer mold 5 at the top.

The heated pressure ram is then pressed against the base plate 1. The elastomer deforms elastically and transmits the pressure quasi-hydrostatically onto the entire modular structure. In the process, the base plate 1 and at least the ceramic substrate 2 deform in accordance with the shape of the surface 8 of the pressure ram 7. A decision as to how high the pressure and temperature of the pressure ram must be depends on the type of material joint between the base plate and the substrate on one hand, and between the ceramic substrate and the semiconductor bodies 4 on the other hand. The parts may be joined, for instance, by soldering, pressure sintering, or diffusion welding. Exemplary embodiments of these joints will be described in conjunction with FIGS. 3 and 4.

Figure 2:
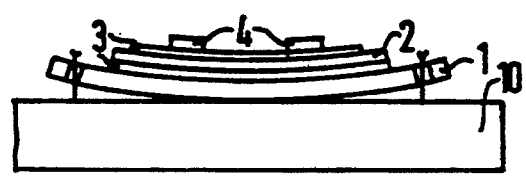
FIG. 2 is a fragmentary, side-elevational view of a modular structure deformed by the device of FIG. 1.

The joined, deformed modular structure is shown diagrammatically in FIG. 2. The deformation is shown in exaggerated fashion in this case. It can be seen that the modular structure is deformed convexly relative to a cooling body 10 onto which it is to be mounted.

As is shown, the modular structure can then be placed flat against the cooling body 10 by means of screws that are inserted through holes made in the base plate 1. The convex deformation must be so pronounced that the convex shape is preserved even in the operating state of the module. The convexity obtained in the compression mold of FIG. 1 is always greater than at room temperature or in the operating state. The amount of the deformation depends on the length and thickness of the metal base plate 1, the length and thickness of the ceramic substrate 2, and the coefficients of thermal expansion of the two parts. Therefore, for a base plate 1 of copper, which is 90 mm in length and 3 to 4 mm in thickness, a ceramic substrate which is 630 $\mu$m thick, and a joining temperature between 200° and 240° C., a convexity of 600 $\mu$m, as measured between the center and the ends of the base, has proved appropriate. The remaining convexity amounted to a further 200 $\mu$m at room temperature in that case.

It is also possible for a modular structure having parts which have already been joined together by soldering to be placed in the compression mold. Then the temperature upon deformation must be below the melting temperature of the solder and high enough to ensure that the solder is readily plastically deformable. It is recommended, however, that the deformation of the modular structure and the joining of its individual parts be performed simultaneously. To that end, the semiconductor bodies, the ceramic substrate and the base plate are each provided with suitable metal layers that enable the aforementioned pressure sintering or diffusion welding.

Figure 3:
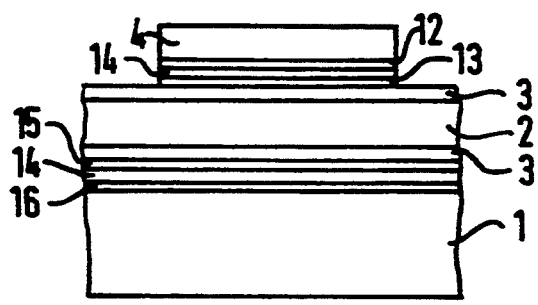
FIG. 3 is a fragmentary, side-elevational view of a first sequence of layers suitable for joining the aforementioned parts.

FIG. 3 shows a modular structure with a sequence of layers that is suitable for the pressure sintering. Elements which are identical to those of FIGS. 1 and 2 are provided with the same reference numerals. The semiconductor body 4, which is made of silicon, has a metal layer 12 on its lower surface or underside. This layer forms the contact with the ceramic substrate. The metal layer 12 may be provided with a multilayer structure in a known manner, with the sequence of layers beginning at the silicon being aluminum, titanium, nickel, and silver. The upper metallizing 3 of the ceramic substrate 2 facing toward the semiconductor body 4, has a silver layer 13. A sintering paste 14 being formed primarily of silver is applied between the silver layer of the metal layer 12 and the silver layer 13. Correspondingly, the metallizing 3 of the ceramic substrate 2 facing toward the base plate 1, has a silver layer 15. The base plate 1 has a silver layer 16. A sintering paste 14 is again applied between the two silver layers 15, 16.

The sintering paste 14 is substantially formed of silver powder with a small particle size, which is suspended in a solvent. After the sintering paste 14 has been applied and the parts have been put together, the sintering paste is first dried. Then the structure of FIG. 4, which is only loosely put-together, is placed in the elastomer mold in the manner described in conjunction with FIG. 1, and then pressed together, for instance at a temperature of 230° C. and a pressure of more than 900 N/cm², for instance 3000–4000 N/cm². The precise procedure of pressure sintering and the specific composition of the sintering paste 14 are not the subject of the present invention. The essential parameters can be found from Published European Application No. 0 330 895 A2.

Figure 4:
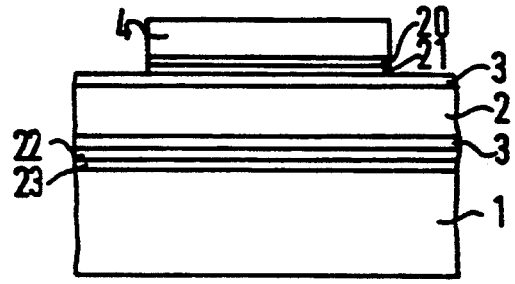
FIG. 4 is a fragmentary, side-elevational view of a second sequence of layers suitable for joining the parts.

The sequence of layers required for diffusion welding is shown in FIG. 4. The semiconductor body 4 is provided with a metal layer 20 on the side thereof facing toward the metallizing 3 of the ceramic substrate 2. As in the exemplary embodiment of FIG. 3, this metal layer 20 may be a multiply layer, having an outer surface or side facing toward the ceramic substrate 2, which is formed of silver. The metallizing 3 facing toward the silicon of the ceramic substrate 2 is likewise provided with a silver layer 21. Correspondingly, the metallizing 3 on the side facing toward the base plate 1 has a silver layer 22, which adjoins a silver layer 23 applied to the base plate 1. The structure of FIG. 4 is then joined together by the method described in conjunction with FIG. 1. The joining temperature may be between 150° and 250° C., and the contact pressure may be in a range from 5000 to 25,000 N/cm². The precise layer thicknesses and the precise other parameters in producing the configuration of FIG. 4 are not the subject of the present invention. They are described in detail in Published European Application No. 0 330 896 A2.

We claim:

1. A method for producing a semiconductor modular structure, which comprises:
   placing semiconductor bodies, a ceramic substrate with metallizing, and a metal base plate, in an elastomer compression mold;
   placing a heatable pressure ram with a surface being concave relative to the base plate, on the base plate; and
   convexely deforming and joining at least the base plate and the ceramic substrate with pressure exerted by the pressure ram, at a temperature above room temperature.

2. The method according to claim 1, which comprises placing metal layers between the semiconductor bodies and the metallizing as well as between the metallizing and the base plate, and joining the metal layers, the semiconductor bodies, the metallizing and the base plate to one another by pressure sintering.

3. The method according to claim 1, which comprises placing metal layers between the semiconductor bodies and the metallizing as well as between the metallizing and the base plate, and joining the metal layers, the semiconductor bodies, the metallizing and the base plate to one another by diffusion welding.

4. The method according to claim 1, which comprises soldering the semiconductor bodies, the metallizing and the base plate prior to being placed in the compression mold, and performing the deformation step at a temperature being lower than a melting temperature of the solder.

* * * * *